(12) United States Patent
Guo et al.

(10) Patent No.: US 11,303,784 B2
(45) Date of Patent: *Apr. 12, 2022

(54) HEAT DISSIPATION ASSEMBLY AND ACTION CAMERA

(71) Applicant: SZ DJI TECHNOLOGY CO., LTD, Shenzhen (CN)

(72) Inventors: Shengjia Guo, Shenzhen (CN); Guisheng Nong, Shenzhen (CN); Kunpeng Jing, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/899,137

(22) Filed: Jun. 11, 2020

(65) Prior Publication Data

US 2020/0344395 A1    Oct. 29, 2020

Related U.S. Application Data

(63) Continuation of application No. 16/540,209, filed on Aug. 14, 2019, now Pat. No. 10,701,249, which is a
(Continued)

(51) Int. Cl.
*H04N 5/225* (2006.01)
*H05K 7/20* (2006.01)
*G03B 17/55* (2021.01)

(52) U.S. Cl.
CPC ....... *H04N 5/22521* (2018.08); *H04N 5/2252* (2013.01); *H05K 7/20309* (2013.01); *H05K 7/20318* (2013.01); *H05K 7/20409* (2013.01)

(58) Field of Classification Search
CPC ............. H04N 5/22521; H04N 5/2252; H04N 5/2254; H05K 7/20309; H05K 7/20318;
(Continued)

(56) References Cited

U.S. PATENT DOCUMENTS 10,250,785 B2    4/2019  Akimoto
10,701,249 B1 *  6/2020  Guo .................. H04N 5/22521
(Continued)

FOREIGN PATENT DOCUMENTS

CN    101539711 A    9/2009
CN    101609836 A    12/2009
(Continued)

OTHER PUBLICATIONS

Extended European Search Report dated Jul. 30, 2020, in corresponding EP Application No. 19742275.1 (5 pages).
(Continued)

*Primary Examiner* — Albert H Cutler
(74) *Attorney, Agent, or Firm* — Finnegan, Henderson, Farabow, Garrett & Dunner, LLP

(57) ABSTRACT

An action camera includes an external housing and a main chip disposed inside the external housing. The action camera also includes a heat dissipation assembly configured to dissipate heat from at least one heat generating component of the action camera. The at least one heat generating component includes the main chip. The heat dissipation assembly includes a heat tube and a first heat dissipation panel. An evaporation end and a condensation end of the heat tube are both in thermal contact with the first heat dissipation panel. The condensation end of the heat tube is disposed farther away from the main chip relative to the evaporation end of the heat tube. The first heat dissipation panel is configured to be in thermal contact with the main chip and the external housing.

20 Claims, 8 Drawing Sheets

Related U.S. Application Data continuation of application No. PCT/CN2019/084839, filed on Apr. 28, 2019.

(58) Field of Classification Search
CPC .......... H05K 7/20409; H05K 7/20336; G03B 17/55
See application file for complete search history.

(56) References Cited

U.S. PATENT DOCUMENTS

| | | | |
|---|---|---|---|
| 2005/0051303 A1* | 3/2005 | Makino | F28D 15/0266 165/104.26 |
| 2008/0316344 A1* | 12/2008 | Yamamiya | G03B 11/00 348/294 |
| 2010/0254698 A1* | 10/2010 | Louis | G03B 17/00 396/448 |
| 2014/0364742 A1 | 12/2014 | Cho et al. | |
| 2015/0070557 A1 | 3/2015 | Petty | |
| 2015/0358564 A1 | 12/2015 | Kang | |
| 2016/0242271 A1 | 8/2016 | Akimoto | |
| 2017/0065259 A1* | 3/2017 | Pinch | A61B 8/467 |
| 2017/0099700 A1 | 4/2017 | Chae et al. | |
| 2017/0264828 A1 | 9/2017 | Perez | |
| 2018/0039162 A1 | 2/2018 | Ali | |
| 2018/0107099 A1* | 4/2018 | Yasuda | H04N 5/22521 |
| 2019/0041144 A1 | 2/2019 | Wan et al. | |
| 2019/0056583 A1 | 2/2019 | Kuhn | |
| 2019/0123486 A1 | 4/2019 | Kimura et al. | |
| 2020/0281096 A1* | 9/2020 | Shioga | G06F 1/203 |

FOREIGN PATENT DOCUMENTS

| | | |
|---|---|---|
| CN | 202383405 U | 8/2012 |
| CN | 103676411 A | 3/2014 |
| CN | 106001917 A | 10/2016 |
| CN | 205670799 U | 11/2016 |
| CN | 206332745 U | 7/2017 |
| CN | 107153317 A | 9/2017 |
| CN | 107277458 A | 10/2017 |
| CN | 207040140 U | 2/2018 |
| CN | 207369504 U | 5/2018 |
| CN | 207677913 U | 7/2018 |
| CN | 208227165 U | 12/2018 |
| CN | 208300209 U | 12/2018 |
| CN | 208768157 U | 4/2019 |
| EP | 3079345 A1 | 10/2016 |
| EP | 3392690 A1 | 10/2018 |
| JP | 2008-245107 | 10/2008 |
| JP | 2008-306489 | 12/2008 |
| JP | 2009-100374 | 5/2009 |
| JP | 2014-158121 A | 8/2014 |
| JP | 2015088888 A | 5/2015 |
| TW | 201215302 A1 | 4/2012 |

OTHER PUBLICATIONS

International Search Report from the State Intellectual Property Office of the P.R. China for International Application No. PCT/CN2019/084839, dated Jan. 9, 2020 (4 pages).

* cited by examiner

HEAT DISSIPATION ASSEMBLY AND ACTION CAMERA

CROSS-REFERENCE TO RELATED APPLICATION

This application is a continuation application of U.S. patent application Ser. No. 16/540,209, filed on Aug. 14, 2019, which is a continuation application of International Application No. PCT/CN2019/084839, filed on Apr. 28, 2019, the entire contents of all of which are incorporated herein by reference.

TECHNICAL FIELD

The present disclosure relates to a technical field of photography and, more specifically, to a heat dissipation assembly and an action camera.

BACKGROUND

As the development of the society and the improvement of people's living standard, entertainment, travel, and extreme sports have become indispensable topics in people's modern life. Ordinary cameras have a poor anti-vibration function for photographing. As such, the photographing effect of people in a moving state is typically not satisfactory. This drives the creation of action cameras.

An action camera includes a main chip, a lens module assembly communicatively connected with the main chip, and a housing for receiving (or accommodating) the main chip and lens. Among these, the lens module assembly is configured to generate optical imaging information based on an object to be photographed and transmit the optical imaging information to the main chip. The main chip is configured to process the optical imaging information and generate corresponding images. The housing for receiving the main chip and the lens is typically made of a plastic material, such that the action camera has excellent anti-collision and anti-dropping functions, which can better protect the action camera.

However, because people have a certain requirement on the portability of action cameras, the volume of an action camera cannot be too large. During the operations of the action camera, the main chip and imaging sensors included in the lens module assembly can generate a large amount of heat. A portion of the heat causes the operation performance of the main chip and the lens module to degrade. Therefore, how to improve the heat dissipation efficiency without increasing the volume of the action camera has become an emerging issue to be addressed in the industry.

SUMMARY

According to an aspect of the present disclosure, an action camera is provided. The action camera includes an external housing and a main chip disposed inside the external housing. The action camera also includes a heat dissipation assembly configured to dissipate heat from at least one heat generating component of the action camera. The at least one heat generating component includes the main chip. The heat dissipation assembly includes a heat tube and a first heat dissipation panel. An evaporation end and a condensation end of the heat tube are both in thermal contact with the first heat dissipation panel. The condensation end of the heat tube is disposed farther away from the main chip relative to the evaporation end of the heat tube. The first heat dissipation panel is configured to be in thermal contact with the main chip and the external housing.

According to the technical solutions of the present embodiments, through configuring the first heat dissipation panel configured to be in thermal contact with the main chip, and the heat tube to be in thermal contact with the first heat dissipation panel, and through configuring the first heat dissipation panel to be in thermal contact with the external housing of the action camera, heat of a portion of the first heat dissipation panel that is in contact with the main chip may be quickly transferred through the heat tube to another portion that is far away from the main chip, and may be conducted out through the external housing. As such, the heat of the main chip may be transferred to the heat tube and the first heat dissipation panel, and be conducted out of the action camera through the external housing that is in thermal contact with the first heat dissipation panel. Therefore, the heat of the main chip may be conducted out through multiple heat dissipation paths, thereby providing an excellent heat dissipation effect for the main chip. In addition, the heat dissipation assembly has a compact structure that occupies a relatively smaller space, and has a relatively small effect on the volume of the action camera, which is advantageous for the portability of the action camera.

Additional advantages of the present disclosure will be provided partially in the following descriptions, will partially become evident from the following descriptions, or can be learned from actual practice of the present disclosure.

BRIEF DESCRIPTION OF THE DRAWINGS

By referring to the following detailed descriptions of the accompanying drawings, the above and other purposes, the features, and the advantages of the embodiments of the present disclosure will become easier to understand. In the drawings, multiple embodiments of the present disclosure will be explained through illustrations and non-limiting manners. Among the drawings.

IN THE DRAWINGS

Figure 1:
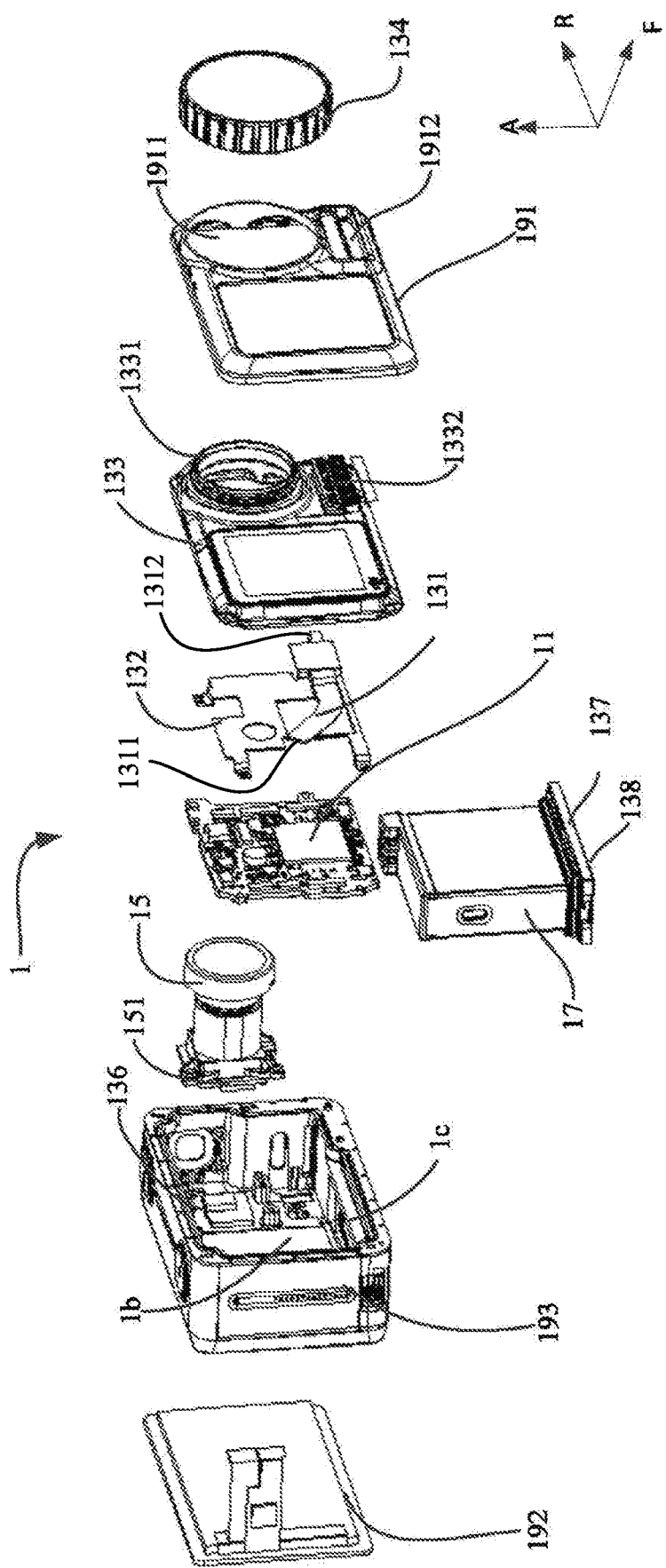
FIG. 1 is an exploded view of an action camera, according to an example embodiment.

1—action camera; 1*a*—electric board; 1*b*—battery chamber; 1*c*—battery chamber opening; 11—main chip; 131— heat tube; 1311—evaporation end; 1312—condensation end; 132—first heat dissipation panel; 1321—first surface; 1322—second surface; 1323—groove; 133—metal cover; 1331—lens cover mounting member; 1332—heat dissipation device; 134—lens cover; 1341—metal heat dissipation ring; 1341*a*—bearing member; 1342—heat conducting ring; 1343—elastic ring; 1343*a*—edge wrapping member; 136—second heat dissipation panel; 137—metal battery cover; 138—plastic member; 15—lens; 151—imaging sensor; 17—battery; 19—external housing; 191—plastic front cover; 192—rear cover; 193—middle frame; 1911—lens passing hole; 1912—heat dissipation window.

DETAILED DESCRIPTION OF THE EMBODIMENTS

Next, some embodiments of the present disclosure will be explained in detail with reference to the drawings. When there is no conflict, the embodiments and features included in the embodiments may be combined with each other.

As used herein, when a first component (or unit, element, member, part, piece) is referred to as "coupled," "mounted," "fixed," "secured" to or with a second component, it is intended that the first component may be directly coupled, mounted, fixed, or secured to or with the second component, or may be indirectly coupled, mounted, or fixed to or with the second component via another intermediate component. The terms "coupled," "mounted," "fixed," and "secured" do not necessarily imply that a first component is permanently coupled with a second component. The first component may be detachably coupled with the second component when these terms are used. When a first component is referred to as "connected" to or with a second component, it is intended that the first component may be directly connected to or with the second component or may be indirectly connected to or with the second component via an intermediate component. The connection may include mechanical and/or electrical connections. The connection may be permanent or detachable. The electrical connection may be wired or wireless. When a first component is referred to as "disposed," "located," or "provided" on a second component, the first component may be directly disposed, located, or provided on the second component or may be indirectly disposed, located, or provided on the second component via an intermediate component. When a first component is referred to as "disposed," "located," or "provided" in a second component, the first component may be partially or entirely disposed, located, or provided in, inside, or within the second component. The terms "perpendicular," "horizontal," "vertical," "left," "right," "up," "upward," "upwardly," "down," "downward," "downwardly," and similar expressions used herein are merely intended for describing relative positional relationship.

It should be understood that in the present disclosure, relational terms such as first and second, etc., are only used to distinguish an entity or operation from another entity or operation, and do not necessarily require or imply that there is an actual relationship or order between the entities or operations. The terms "comprising," "including," or any other variations are intended to encompass non-exclusive inclusion, such that a process, a method, an apparatus, or a device having a plurality of listed items not only includes these items, but also includes other items that are not listed, or includes items inherent in the process, method, apparatus, or device. Without further limitations, an item modified by a term "comprising a . . . " does not exclude inclusion of another same item in the process, method, apparatus, or device that includes the item.

A person having ordinary skills in the art can appreciate that when the term "and/or" is used, the term describes a relationship between related items. The term "and/or" means three relationships may exist between the related items. For example, A and/or B can mean A only, A and B, and B only. The symbol "/" means "or" between the related items separated by the symbol. The phrase "at least one of" A, B, or C encompasses all combinations of A, B, and C, such as A only, B only, C only, A and B, B and C, A and C, and A, B, and C. The term "and/or" may be interpreted as "at least one of." The term "communicatively coupled" or "communicatively connected" indicates that related items are coupled or connected through a communication channel, such as a wired or wireless communication channel.

Referring to FIG. 1 to FIG. 7, the present disclosure provides an action camera 1. The action camera 1 may include an external housing 19. The external housing 19 may include a mounting space formed inside for mounting a main chip 11, a lens 15, and a battery 17.

For the convenience of descriptions, the present embodiment and the following embodiments may use a side of the action camera 1 where the lens is located as a front end, and a side opposing the front end as a rear end. When the action camera 1 is placed horizontally, a side of the action camera 1 facing the ground may be a down side (or a bottom end), and a side opposing the down side may be an upper side (or top end). In the remaining two sides, a side where the lens 15 is located may be a right side, and the other side may be a left side.

In the drawings, a direction pointed by an arrow F may be the front direction, a direction pointed by an arrow A may be the upper direction, and a direction pointed by an arrow R may be a right direction.

In some embodiments, a portion, such as a vertex portion, of the external housing 19 may be made of a plastic material, such that the action camera 1 may have an excellent anti-collision and anti-dropping performance to better protect the action camera 1. In some embodiments, a portion of the external housing 19 may be made of a metal material. For example, a portion of the external housing 19 corresponding to a heat generating component of the action camera 1 may be made of a metal material (e.g., an exterior of the portion may be wrapped with a plastic layer), such that the heat of the heat generating component can be quickly transferred out.

Figure 2:
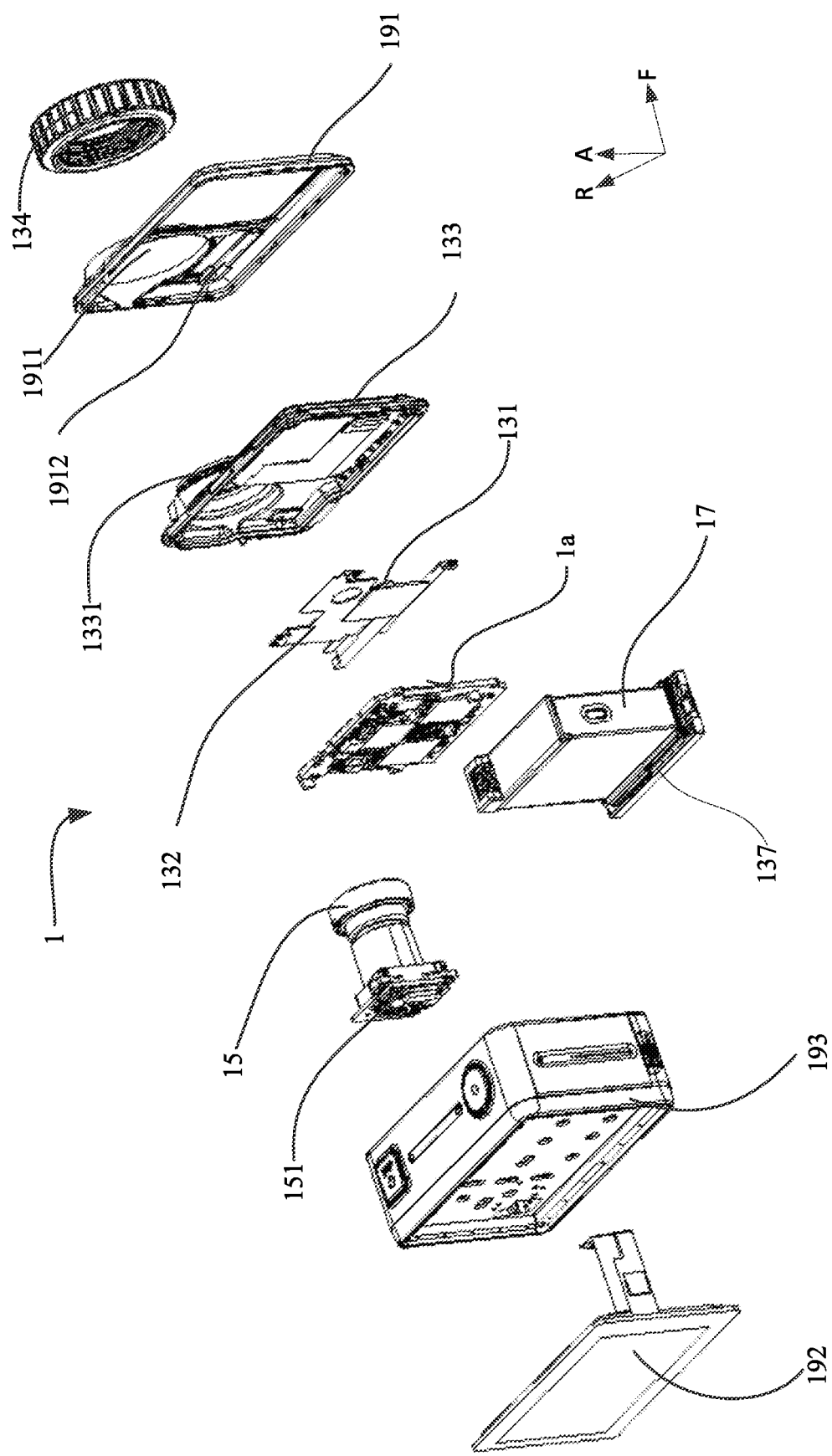
FIG. 2 is another exploded view of the action camera, according to an example embodiment.

As shown in FIG. 1 and FIG. 2, illustratively, the external housing 19 may include a middle frame 193. A rear end of the middle frame 193 may be provided with a rear cover 192. The rear cover 192 and the middle frame 193 may be integrally provided or may be detachably connected. A front end of the middle frame 193 may be provided with a front cover. The front cover may be detachably connected with the middle frame 193 for the convenience of subsequent maintenance of the internal parts of the action camera. The rear cover 192 or the middle frame 193 may be at least partially made of a plastic material, such that the action camera 1 has an excellent anti-collision and anti-dropping performance. In some embodiments, the rear cover 192 or the middle frame 193 may be at least partially made of a metal material, such that the action camera 1 has an excellent heat dissipation performance. In some embodiments, the front cover may be made of a plastic material. In some embodiments, the front cover is a plastic front cover, such that the action camera 1 has an excellent anti-collision and anti-dropping performance and heat insulation performance.

In some embodiments, the front cover and the rear cover 192 may both be provided with a display screen. During normal photographing, the lens of the action camera 1 may face an object to be photographed, i.e., facing the front side. The display screen on the rear cover 192 may face a user such that the user can view the photographed images. When the user takes a selfie picture, the lens may face the user, and the display screen on the front cover may also face the user such that the user can view the photographed images. The lens and the display screen on the front cover may be provided in a staggered manner to avoid interference between the two.

As shown in FIG. 1 and FIG. 2, the main chip 11 may be provided on an electric board 1a disposed inside the external housing 19, and may be configured to process data from various sensors included in the action camera 1. The main chip 11 may be configured to exchange information with an external environment, such as receiving a control command input by a user, and outputting acquired image information, etc. The main chip 11 may also be configured to control an operation state of the action camera 1 based on the data from various sensors, the control command input by the user, and a pre-stored control command, etc. Because the main chip 11 needs to process a large amount of data, a large amount of heat may be generated during the operation. Therefore, the main chip 11 is one of the heat generating components in the action camera 1.

As shown in FIG. 1 to FIG. 5, the action camera 1 may also include a heat dissipation assembly. The heat dissipation assembly may be configured to dissipate heat for the heat generating components of the action camera 1. The heat dissipation assembly may include a heat tube 131 and a first heat dissipation panel 132 configured to dissipate heat for the main chip 11.

The heat tube 131 may include an evaporation end 1311 and a condensation end 1312. The evaporation end 1311 of the heat tube 131 may be in thermal contact with the main chip 11 to absorb heat of the main chip 11, and to transfer the heat to the condensation end 1312 for release. The condensation end 1312 of the heat tube 131 may be located farther away from the main chip 11 relative to the evaporation end 1311 of the heat tube 131. For example, the condensation end 1312 of the heat tube 131 may extend to a surface extending out of the main chip 11. That is, the condensation end 1312 of the heat tube 131 may not be in contact with the main chip 11 to avoid the influence of the heat released by the condensation end 1312 on the heat dissipation of the main chip 11.

The evaporation end 1311 and the condensation end 1312 of the heat tube 131 may both be in thermal contact with the first heat dissipation panel 132. The evaporation end 1311 of the heat tube 131 may be in thermal contact with a portion of the first heat dissipation panel 132 that corresponds to the main chip 11, such that heat of the portion of the first heat dissipation panel 132 that contacts the main chip 11 can be quickly transferred to a portion of the first heat dissipation panel 132 that is far away from the main chip 11 through the evaporation end 1311 and the condensation end 1312. The heat may be further conducted out through the external housing 19 of the action camera 1 that is in thermal contact with the first heat dissipation panel 132. The first heat dissipation panel 132 may extend outwardly from the heat tube 131 until it directly contacts the external housing 19 of the action camera 1, such that the heat of the first heat dissipation panel 132 may be conducted out of the action camera 1 through the external housing 19.

In some embodiments, at least a portion of the evaporation end 1311 and at least a portion of the condensation end 1312 may be in direct contact with the first heat dissipation panel 132. In some examples, at least a portion of the heat tube 131 may be provided in contact with a surface of the first heat dissipation panel 132, such that the there is a relatively large contacting area, i.e., heat transfer area, between the heat tube 131 and the first heat dissipation panel 132. In other examples, the first heat dissipation panel 132 may be provided with a mounting groove. The heat tube 131 may be received in the mounting groove of the first heat dissipation panel 132, which may be advantageous for the compactness of the structure of the action camera 1. In some embodiments, the coupling method between the heat tube 131 and the first heat dissipation panel 132 is not limited to the above disclosure. The present embodiment only provides an illustrative example. Any coupling method may be used as long as the first heat dissipation panel 132 can be in thermal contact with the heat tube 131 to quickly conduct out the heat of the heat tube 131.

Through thermally connecting both the evaporation end 1311 and the condensation end 1312 of the heat tube 131 with the first heat dissipation panel 132, a portion of the heat of a portion of the first heat dissipation panel 132 that is in thermal contact with the main chip 11 can be quickly transferred to a portion of the first heat dissipation panel 132 that is far away from the main chip 11 through the evaporation end 1311 and the condensation end 1312 of the heat tube 131. Another portion of the heat of the portion of the first heat dissipation panel 132 that is in thermal contact with the main chip 11 can be transferred to the portion that is far away from the main chip 11 through the first heat dissipation panel 132 itself. As such, the heat of the main chip 11 can be quickly conducted out, thereby improving the heat dissipation effect for the main chip 11.

The first heat dissipation panel 132 may be configured to directly contact the main chip 11, such that a portion of the heat of the main chip 11 can be quickly transferred to the first heat dissipation panel 132, and further be conducted out through the external housing 19 of the action camera 1 that is in thermal contact with the first heat dissipation panel 132. Illustratively, the heat tube 131 and the first heat dissipation panel 132 may be disposed at the front end of the main chip 11.

The first heat dissipation panel 132 may extend outwardly from the heat tube 131 until it contacts the external housing 19 of the action camera 1, such that the heat of the first heat dissipation panel 132 can be conducted out through the external housing 19 of the action camera 1. In some embodiments, the area of the surface of the first heat dissipation panel 132 that is in contact with the main chip 11 may be greater than the area of the corresponding surface of the main chip 11, such that the first heat dissipation panel 132 can be in contact with more regions of the main chip 11. As such, there is a relatively large contacting area, i.e., heat transfer area, between the first heat dissipation panel 132 and the main chip 11, thereby improving the heat dissipation effect for the main chip 11.

Illustratively, the first heat dissipation panel 132 may be in direct contact with the main chip 11. The first heat dissipation panel 132 may directly or indirectly contact the external housing 19. At least a portion of the heat tube 131 may be in direct contact with the first heat dissipation panel 132. At least a portion of the heat tube 131 may be in direct contact with the main chip 11. For example, the heat tube 131 may be in thermal contact with the main chip through the first heat dissipation panel 132. The heat tube 131 may be in indirect contact with the external housing 19. For example, the heat tube 131 may be in thermal contact with the external housing 19 through the first heat dissipation panel 132.

In some embodiments, a portion of the heat of the main chip 11 may be transferred to the heat tube 131 through a portion of the first heat dissipation panel 132 that is in contact with the main chip 11, and be transferred to a portion of the first heat dissipation panel 132 that is far away from the main chip 11 through the heat tube 131, and further be conducted out through the external housing 19 of the action camera 1 that is in thermal contact with the first heat dissipation panel 132. Another portion of the heat of the main chip 11 may be directly transferred to the first heat dissipation panel 132, and be conducted out through the external housing 19 of the action camera 1 that is in thermal contact with the first heat dissipation panel 132. As such, both of the heat tube 131 and the first heat dissipation panel 132 may have heat dissipation functions for the main chip 11. The heat tube 131 may quickly conduct the heat of a portion of the first heat dissipation panel 132 that is in contact with the main chip 11 to another portion of the heat dissipation panel 132 that is far away from the main chip 11, such that the heat of the main chip 11 can be quickly conducted out. As a result, the temperature increase problem of the main chip 11 can be effectively solved, which is advantageous to ensure the reliability of the operation performance of the action camera 1.

In the heat dissipation assembly of the present disclosure, through configuring the first heat dissipation panel 132 that is in thermal contact with the main chip 11, and the heat tube 131 that is in contact with the first heat dissipation panel 132, and through configuring the first heat dissipation panel 132 to be in thermal contact with the external housing 19 of the action camera 1, the heat of a portion of the first heat dissipation panel 132 that is in contact with the main chip 11 can be quickly transferred to a portion of the first heat dissipation panel 132 that is far away from the main chip 11 through the heat tube 131, and be further conducted out through the external housing 19. As such, the heat of the main chip 11 can be quickly transferred to the heat tube 131 and the first heat dissipation panel 132, and be conducted out of the action camera 1 through the external housing 19 that is in thermal contact with the first heat dissipation panel 132. Therefore, the heat of the main chip 11 can be conducted out through multiple heat dissipation paths, resulting in an excellent heat dissipation effect for the main chip 11. In addition, the heat dissipation assembly has a compact structure that occupies a relatively small space, which has a relatively small effect on the volume of the action camera 1. The disclosed configuration is advantageous for the portability of the action camera 1.

In some embodiments, the first heat dissipation panel 132 may include a first surface 1321 and a second surface 1322 that are opposingly disposed. A portion of the first surface 1321 may cover the main chip 11, i.e., a portion of the first surface 1321 may be in contact with the main chip 11. The heat tube 131 may be disposed at the second surface 1322.

Illustratively, the first surface 1321 may include a contacting region that is in contact with the main chip 11. The shape of the contacting region may match with that of the main chip 11. For example, the main chip 11 may have a rectangular shape, and the contacting region may also have a rectangular shape. At least one side of the contacting region may extend outwardly, i.e., extend in a direction away from the main chip 11, and may extend until it contacts the external housing 19 of the action camera 1, such that the first heat dissipation panel 132 is in thermal contact with the external housing 19.

At least a portion of the heat tube 131 may be disposed at the second surface 1322, i.e., disposed at a side of the first heat dissipation panel 132 facing away from the main chip 11. In some embodiments, the entire heat tube 131 may be disposed at the second surface 1322. Then, the evaporation end 1311 of the heat tube 131 may be in thermal contact with the main chip 11 through the first heat dissipation panel 132. In other embodiments, the evaporation end 1311 of the heat tube 131 may extend out of the first heat dissipation panel 132, such that the portion of the evaporation end 1311 that extends out of the first heat dissipation panel 132 can contact the main chip 11. The portion of the evaporation end 1311 that extends out of the first heat dissipation panel 132 may bend toward the main chip 11 to contact the main chip 11, or the portion of the evaporation end 1311 that extends out of the first heat dissipation panel 132 may contact the main chip 11 through a heat conducting medium, such as a heat conducting silicone gel.

In some embodiments, a portion of the heat tube 131 located adjacent the evaporation end 1311 may be obliquely disposed relative to an extending direction of the length of the main chip 11, such that there is a relatively large heat transfer area between the heat tube 131 and the main chip 11, which makes it convenient for the condensation end 1312 to extend out of the main chip 11 to reduce the effect of the condensation end 1312 on the main chip 11. This configuration also makes the structure of the heat dissipation assembly compact, thereby reducing the space occupied by the action camera 1.

Illustratively, an angle between a portion of the heat tube 131 located adjacent the evaporation end 1311 and the length direction of the main chip 11 may be 30 degrees, 45 degrees, 60 degrees, etc. A portion of the heat tube 131 located adjacent the condensation end 1312 may be smoothly connected with a portion that is located adjacent the evaporation end 1311. In addition, a portion of the heat tube 131 located adjacent the condensation end 1312 may be disposed extending along the length direction of the action camera 1, thereby reducing the space occupied by the action camera 1, which is advantageous for miniaturization and portability of the action camera 1.

In some embodiments, a groove 1323 may be formed in a region of the second surface 1322 corresponding to the main chip 11. The portion of the heat tube 131 located adjacent the evaporation end 1311 may be disposed in the groove 1323. The shape of the groove 1323 may match with the shape of the portion of the heat tube 131 that is located adjacent the evaporation end 1311.

Through disposing the main chip 11 in the groove 1323 of the first heat dissipation panel 132, not only positioning of the heat tube 131 can be realized, the structure of the heat dissipation assembly can be made more compact, such that the assembly of the first heat dissipation panel 132 and the heat tube 131 has a relatively small size along the thickness direction of the action camera 1, thereby reducing the space occupied by the action camera 1, which is advantageous for the miniaturization and portability of the action camera 1.

In some embodiments, as shown in FIG. 1 to FIG. 2, the heat dissipation assembly may also include a metal cover 133. The metal cover 133 may be made of a metal material having an excellent thermal conductivity, such that the heat of the first heat dissipation panel 132 can be quickly conducted out. Illustratively, the metal cover 133 may be disposed at a front end of the first heat dissipation panel 132.

The metal cover 133 may include a cover body. The cover body may be provided with an avoidance member configured to avoid components such as a display screen and a lens. The cover body may be connected with an edge extending backwardly. The first heat dissipation panel 132 may extend to abut against at least a portion of the edge and/or at least a portion of the cover body, such that the heat of the first heat dissipation panel 132 may be transferred to the metal cover 133.

In some embodiments, at least a portion of the metal cover 133 may be disposed under the external housing 19 of the action camera 1, and be thermally connected with the first heat dissipation panel 132. The metal cover 133 may be located inside the external housing 19, i.e., the metal cover 133 may be enclosed within the external housing 19, and the metal cover 133 may be in thermal contact with the external housing 19. The external housing 19 may be in contact with air outside of the action camera 1, such that the heat of the first heat dissipation panel 132 may be transferred to the metal cover 133, and the metal cover 133 may dissipate the heat outside of the action camera 1 by exchanging heat with the air outside of the action camera 1 through the external housing 19, thereby realizing heat dissipation.

In other embodiments, the metal cover 133 may be partial external housing 19 of the action camera 1, i.e., the metal cover 133 may be a part of the external housing 19 of the action camera 1. At least the surface of the metal cover 133 may be exposed to the outside, i.e., at least a surface of the metal cover 133 may be in contact with the air outside of the action camera 1, such that the heat of the first dissipation panel 132 may be transferred to the metal cover 133. A portion of the heat of the metal cover 133 can exchange heat with the air outside of the action camera 1, and another portion of the heat of the metal cover 133 can exchange heat with the air outside of the action camera 1 through the external housing 19, thereby dissipating heat outside of the action camera 1, i.e., realizing heat dissipation.

In some embodiments, through configuring the first heat dissipation panel 132 to be in thermal contact with the metal cover 133, the metal cover 133 can quickly conduct out the heat of the first heat dissipation panel 132, thereby improving the heat dissipation effect for heat generating components of the action camera 1 such as the main chip 11.

In some embodiments, the heat dissipation assembly may also include a first heat conducting pad. The first heat conducting pad may be in thermal contact with the first heat dissipation panel 132, and in thermal contact with the metal cover 133. The first heat conducting pad may have a flake-shaped structure having certain elasticity that is made of a heat conducting medium, such as a flake-shaped structure having certain elasticity that is made of a heat conducting silicone gel.

Through disposing the first heat conducting pad between the first heat dissipation panel 132 and the metal cover 133, the first heat conducting pad may suitably fill a gap between the first heat dissipation panel 132 and the metal cover 133, such that there is a relatively large contacting area between the first heat dissipation panel 132 and the metal cover 133, thereby improving the heat transfer efficiency between the first heat dissipation panel 132 and the metal cover 133. As a result, the heat dissipation effect on the action camera 1 can be improved.

In some embodiments, the heat dissipation assembly may include a lens cover 134. At least a portion of the lens cover 134 may be made of a metal material. The lens cover 134 may be disposed to cover a lens 15 of the action camera 1 to protect the lens 15. Correspondingly, the metal cover 133 may be provided with a lens cover mounting member 1331 configured to mount the lens cover 1334. Illustratively, the lens cover mounting member 1331 may be disposed at a right upper portion of the metal cover 133.

Because the lens cover 134 has an excellent heat conductivity, and at least a portion of the lens cover 134 that covers the lens 15 is exposed to the outside, i.e., at least a portion of the lens cover 134 is in contact with the air outside of the action camera 1; additionally, because the lens cover 134 is connected with the lens cover mounting member 1331 of the metal cover 133, i.e., the lens cover 134 is connected and in contact with the metal cover 133, the heat transferred by the first heat dissipation panel 132 to the metal cover 133 can also be quickly conducted out through the lens cover 134.

In some embodiments, the configuration of the first heat dissipation panel 132 being distributed circumferentially along at least a portion of the lens cover mounting member 1331, such that there is a relatively large contacting area between the first heat dissipation panel 132 and the metal cover 133, which can also avoid the first heat dissipation panel 132 affecting components such as the lens 15, is advantageous for the compactness of the action camera 1. In addition, the disclosed configuration is also advantageous for the miniaturization of the action camera 1, and advantageous for the portability of the action camera 1.

Illustratively, an avoidance member may be disposed in a region of the first heat dissipation panel 132 corresponding to the lens cover mounting member 1331. The avoidance member may be configured to dispose components such as the lens 15. In one possible implementation method, the avoidance member may be an avoidance hole. The first heat dissipation panel 132 may be disposed along the entire circumference of the lens cover mounting member 1331. In another possible implementation method, the avoidance member may be an avoidance groove. The first heat dissipation panel 132 may be disposed along a portion of the circumference of the lens cover mounting member 1331.

In some embodiments, the lens cover mounting member 1331 may be a protrusion member on the metal cover 133 facing away from the first heat dissipation panel 132. The protrusion member may be provided with a thread. The lens cover 134 may be connected with the metal cover 133 through the thread, such that there is a relatively large contacting area between the metal cover 133 and the lens cover 134, thereby improving the heat transfer efficiency between the metal cover 133 and the lens cover 134. The thread is also convenient for detaching the lens cover 134.

In one of the possible implementation methods, the protrusion member may be provided with an external thread. The lens cover 134 may be provided with an internal thread. As such, at least a portion of the protrusion member may be inserted into the lens cover 134, and the protrusion member may be connected with the lens cover 134 through the threads. In another one of the possible implementation methods, the protrusion member may be provided with an internal thread, and the lens cover 134 may be provided with an external thread. As such, at least a portion of the lens cover 134 may be inserted into the protrusion member, and the protrusion member may be connected with the lens cover 134 through the threads.

Figure 8:
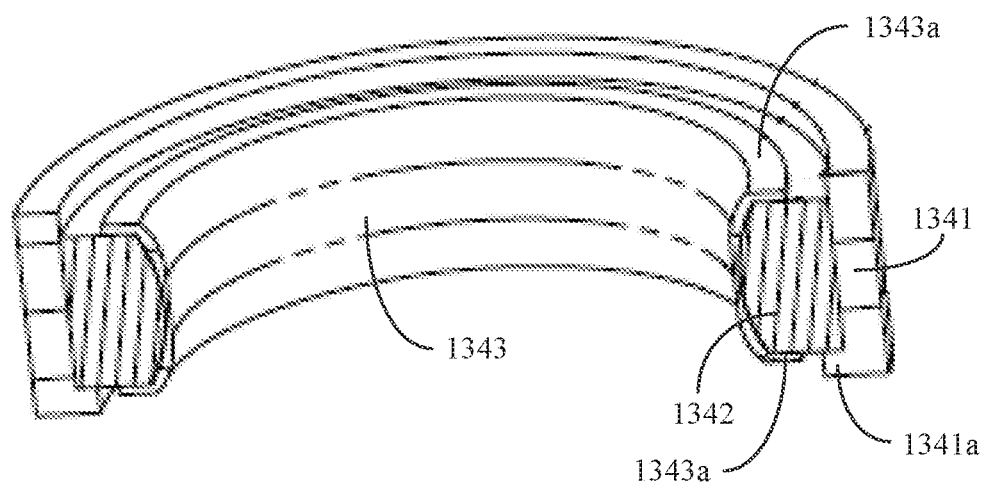
FIG. 8 is a structural schematic diagram of the lens cover of the action camera, according to an example embodiment.

In some embodiments, as shown in FIG. 8, the lens cover 134 may include: a metal heat dissipation ring 1341. An inner wall of the metal heat dissipation ring 1341 may extend inwardly along a radial direction to form a bearing member 1341a. The lens cover 134 may also include a heat conducting ring 1342 disposed at the inner wall of the metal heat dissipation ring 1341, and configured to abut against the bearing member 1341*a*. The inner wall of the heat conducting ring 1342 may be configured to contact and couple with the lens 15 of the action camera 1.

As such, the heat conducting ring 1342 may be a heat conducting body to contact and couple with the lens 15, and may conduct out the heat from a contacting surface that contacts the lens 15. In addition, through the metal heat dissipation ring 1341 contacting and coupling with the heat conducting ring 1342, a portion of the heat of the heat conducting ring 1342 may be conducted out, thereby realizing the function of dissipating heat from the lens 15.

In some embodiments, the metal heat dissipation ring 1341 may be a beryllium-copper alloy heat dissipation ring. The beryllium-copper alloy is a highly efficient heat conducting metal material. The heat conductivity of the beryllium-copper alloy is not smaller than 105 w/m.k, which is 6 times of that of the stainless steel. The beryllium-copper alloy has an excellent heat conducting effect, which can ensure the heat dissipation effect of the action camera 1.

In some embodiments, the heat conducting ring 1342 may be a heat conducting gel ring. The heat conducting gel is a gel shaped object, has a high heat conductivity of about 5 w/m.k. Because it is in a gel shape, the heat conducting gel can be used as a heat conducting medium to be applied between the lens 15 and the metal heat dissipation ring 1341, which can increase the heat dissipation area of the lens 15 and the heat absorption area of the metal heat dissipation ring 1341. The heat conducting gel can further improve the heat dissipation effect on the lens 15 of the action camera 1.

In one of the possible implementation methods, the bearing member 1341*a* may be located at an end of the inner wall of the metal heat dissipation ring 1341. Illustratively, an end of the heat conducting ring 1342 may abut against the bearing member 1341*a*, and another end of the heat conducting ring 1342 may flush with the end of the metal heat dissipation ring 1341. As such, the bearing member 1341*a* occupies as little inner wall space of the metal heat dissipation ring 1341 as possible. The remaining portion of the inner wall of the metal heat dissipation ring 1341 may be configured to contact and couple with the heat conducting ring 1342, to increase the area of the heat conducting ring 1342 to a maximum degree, thereby improving the heat dissipation effect on the lens 15.

In some embodiments, the bearing member 1341*a* may be formed at the inner wall of the metal heat dissipation ring 1341 in a ring shape along the circumference of the metal heat dissipation ring 1341. The bearing member 1341*a* may fully contact the heat conducting ring 1342 to achieve the optimum supporting effect. In other embodiments, there may be multiple bearing members 1341*a* evenly distributed at the inner wall of the metal heat dissipation ring 1341. For example, the multiple bearing members 1341*a* may be disposed with an interval between them, which can also function to support the heat conducting ring 1342.

Additionally, a pre-configured distance between the inner wall of the metal heat dissipation ring 1341 and the lens 15 may be smaller than a thickness of the heat conducting ring 1342 along a radial direction. When the lens 15 is placed in the lens cover 134, to avoid friction between the lens 15 and the metal heat dissipation ring 1341 of the lens cover 134, which may scratch an exterior surface of the lens 15, a safe distance of more than 0.5 mm may be pre-configured between the inner wall of the metal heat dissipation ring 1341 and the lens 15. A 0.7 mm thick heat conducting ring 1342 may be disposed at the inner wall of the metal heat dissipation ring 1341. In some embodiments, when disposing the 0.70 mm thick heat conducting ring 1342 in the 0.5 mm gap, during the process when the lens 15 is inserted into the lens cover 134, the lens 15 may interfere with the heat conducting ring 1342, such that the heat conducting ring 1342 may tightly wrap the lens 15, thereby increasing the contacting area between the lens 15 and the heat conducting ring 1342, which improves the heat dissipation performance.

In some embodiments, the lens cover 134 may also include an elastic ring 1343. The elastic ring 1343 may be provided at the inner wall of the heat conducting ring 1342. The inner wall of the elastic ring 1343 may be configured to contact and couple with the lens 15. In some embodiments, the elastic ring 1343 may be a silicone gel ring. Silicone gel is an elastic material, which can deform under a pressure, and restore to a previous shape when the pressure is released. The heat conductivity of the silicone gel is about 0.27 w/m.k, which is about 10 times of that of the air. The heat conductivity of the air is about 0.024 w/m.k.

Through configuring a soft elastic ring 1343 between the heat conducting ring 1342 and the lens 15, the lens 15, which is a heat generating component, and its exterior surface may not be damaged. Therefore, under the condition of not damaging the surface of the lens 15, which is a heat generating component, the elastic ring 1343 may closely contact the lens 15, thereby conducting out the heat from the contacting surface. In addition, the silicone gel is a resilient material, which may maintain its original shape after the lens 15 is repeatedly inserted and pulled out in a shear direction. Therefore, the silicone gel can be repeatedly used, which is suitable for devices such as lens 15 that need heat dissipation and can be repeatedly inserted and pulled out.

Two sides of the elastic ring 1343 may extend along the radial direction to form an edge wrapping member 1343*a*. The edge wrapping member 1343*a* may wrap a side wall of the heat conducting ring 1342. That is, a ring of groove member may be formed at an outer wall of the elastic ring 1343, such that the heat conducting ring 1342 is embedded inside, which can make the connection between the elastic ring 1343 and the heat conducting ring 1342 tighter, and can prevent the heat conducting ring 1342 from separating from the metal heat dissipation ring when the heat conducting ring 1342 deforms under a pressure.

In one of the possible implementation methods, a pre-configured distance between an inner wall of the metal heat dissipation ring 1341 and the lens 15 may be smaller than a sum of the thickness of the heat conducting ring 1342 in the radial direction and the thickness of the elastic ring 1343 in the radial direction. In some embodiments, when the lens 15 is placed into the lens cover 134 to avoid the friction between the lens 15 and the metal heat dissipation ring 1341 of the lens cover 134, which may scratch the exterior surface of the lens 15, a safe distance of more than 0.5 mm may be pre-configured between the inner wall of the metal heat dissipation ring 1341 and the lens 15. The inner wall of the metal heat dissipation ring 1341 may be provided with a 0.4 mm thick heat dissipation ring 1342, and a 0.3 mm thick elastic ring 1343 may be provided on the heat dissipation ring 1342. Thus, in the 0.5 mm gap, the heat dissipation ring 1342 and elastic ring 1343 having a total thickness of 0.70 mm may be disposed. During the process of the lens 15 being inserted into the lens cover 134, the lens 15 may interfere with the elastic ring 1343, such that the elastic ring 1343 may tightly wrap around the lens 15, thereby increasing the heat dissipation area of the lens 15 and the lens cover 134, and improving the heat dissipation performance.

In some embodiments, as shown in FIG. 1 to FIG. 2, and FIG. 6 to FIG. 7, the external housing 19 may include a plastic front cover 191. The plastic front cover 191 may be disposed at a side of the metal cover 133 facing away from the main chip 11, i.e., the plastic front cover 191 may be disposed at a front end of the metal cover 133. The plastic front cover 191 may be provided with a lens passing hole 1911. The lens cover mounting member 1331 may be connected with the lens cover 134 at the lens passing hole 1911.

In some embodiments, the metal cover 133 may be located under the plastic front cover 191, i.e., the metal cover 133 may be wrapped at an inner side of the plastic front cover 191. In other words, the metal cover 133 may be wrapped at a rear end of the plastic front cover 191. In some embodiments, the metal cover 133 may be located at the rear end of the plastic front cover 191, and at least a portion of the metal cover 133 is exposed to the outside, i.e., at least a portion of the metal cover 133 is in contact with the air outside of the action camera 1.

A portion of the plastic front cover 191 corresponding to the lens cover mounting member 1331 may be provided with the lens passing hole 1911. The lens passing hole may be configured to allow at least one of the lens cover mounting member 1331 and the lens cover 134 to pass through, such that the lens cover mounting member 1331 is connected with the lens cover 134. Illustratively, the lens cover mounting member 1331 may include an external thread, and at least a portion of the lens cover mounting member 1331 is penetratingly disposed in the lens passing hole. The lens cover 134 may include an internal thread. A rear end of the lens cover 134 may abut against a portion of the plastic front cover 191 that is located surrounding the lens passing hole 1911, and the lens cover 134 may be connected with the lens cover mounting member 1331 through the threads.

In some embodiments, through configuring the plastic front cover 191, the action camera 1 may have an excellent anti-collision and anti-dropping performance, which can better protect the action camera 1.

In some embodiments, a side of the metal cover 133 facing away from the first heat dissipation panel 132 may be provided with a heat dissipation device 1332, i.e., the front end of the metal cover 133 may be provided with the heat dissipation device 1332. As such, a portion of the heat of the first heat dissipation panel 132 and the lens 15 may be quickly conducted out through the heat dissipation device 1332. The heat dissipation device 1332 and the lens cover mounting member 1331 may be disposed adjacent the condensation end 1312 of the heat tube 131. That is, the heat dissipation device 1332 and the lens cover mounting member 1331 may be disposed adjacent a portion of the first heat dissipation panel 132 that is connected with the condensation end 1312, such that the heat of the main chip 11 that is directly transferred to the first heat dissipation panel 132, and the heat transferred to the first heat dissipation panel 132 through the heat tube 131 can be quickly transferred to the lens cover mounting member 1331 and the heat dissipation device 1332. Illustratively, the portion of the first heat dissipation panel 132 that is connected with the condensation end 1312 may be disposed adjacent an edge of the metal cover 133, such that the heat of the first heat dissipation panel 132 may be quickly conducted out of the action camera 1 through the metal cover 133. Correspondingly, the heat dissipation device 1332 and the lens cover mounting member 1331 may be disposed adjacent the edge of the metal cover 133.

The heat dissipation device 1332 may be disposed at a portion of the external circumference of the lens cover mounting member 1331. For example, the lens cover mounting member 1331 may be disposed adjacent an edge of the metal cover 133, e.g., the lens cover mounting member 1331 may be disposed adjacent the right edge and the upper edge of the metal cover 133. In some embodiments, the heat dissipation device 1332 may be disposed at the left side and/or the right side of the lens cover mounting member 1331, and adjacent the lens cover mounting member 1331. In some embodiments, the heat dissipation device 1332 may be disposed at a front surface of the metal cover 133 that is adjacent the external air, such that the heat dissipation device 1332 may directly contact the external air, thereby improving the heat dissipation effect. In some embodiments, the disclosed configuration can prevent the heat dissipation device 1332 from occupying the internal space of the action camera 1, which is advantageous for the compactness of the internal structure of the action camera 1.

The heat dissipation device 1332 may be a thermal radiation type heat dissipation device to increase the heat dissipation area of the metal cover 133, thereby improving the heat dissipation effect. In some embodiments, the thermal radiation type heat dissipation device can propagate thermal energy in the form of a radiation, i.e., the thermal radiation type heat dissipation device may directly exchange heat with the air through its own surface, and may not need to rely on other medium. The structure is simple, and has little effect on the volume of the action camera 1.

Illustratively, the heat dissipation device 1332 may include at least one heat dissipation fin. For example, the heat dissipation device 1332 may include multiple heat dissipation fins arranged side-by-side. Each heat dissipation fin may be disposed to extend from a surface of the metal cover 133 facing away from the first heat dissipation panel 132 in a direction moving away from the first heat dissipation panel 132. That is, each heat dissipation fin may extend forwardly from a front surface of the metal cover 133. In some embodiments, the heat dissipation fin may be disposed to extend along the up-and-down direction of the action camera 1, such that the front surface of the metal cover 133 may be provided with more heat dissipation fins to further increase the heat dissipation area of the metal cover 133. A predetermined gap may be configured between two adjacent heat dissipation fins to help ensure the efficiency of heat exchange between each heat dissipation fin and the external air. As such, multiple heat dissipation fins may be evenly distributed along the length direction, i.e., the left-right direction, of the action camera 1, such that the heat dissipation device 1332 can have a relatively large heat dissipation area, and can have an excellent heat exchange efficiency with the external air, thereby further enhancing the heat dissipation effect on the action camera 1.

In the present disclosure, the distribution method of the heat dissipation fins is not limited to the above described. For example, the heat dissipation fins may be radially distributed at a portion of the external circumference of the lens cover mounting member 1331. The structure of the heat dissipation device is also not limited to the above described. For example, the heat dissipation device may include multiple column-shaped structures. The multiple column-shaped structures may be distributed in an array, such that the heat dissipation device 1332 can have a relatively large heat dissipation area, and an excellent heat exchange efficiency with the external air, thereby further enhancing the heat dissipation effect on the action camera 1.

In the present disclosure, the type of the heat dissipation device 1332 is not limited to the above described. For example, the heat dissipation device 1332 may be a convective flow type heat dissipation device.

In some embodiments, to further improve the heat dissipation effect of the heat dissipation device 1332, the plastic front cover 191 provided at the front end of the metal cover 133 may be provided with a heat dissipation window 1912, such that a portion of the heat dissipation device 1332 may be exposed through the heat dissipation window 1912 to exchange heat with the air external to the action camera 1. Illustratively, the shape of the heat dissipation window 1912 may match with the shape of the heat dissipation device 1332, such that more of the surface of the heat dissipation device 1332 can be exposed through the heat dissipation window 1912.

In some embodiments, the portion of the first heat dissipation panel 132 that is connected with the condensation end 1312 may be disposed adjacent the lens cover mounting member 1331 and/or the heat dissipation device 1332, such that the heat released by the condensation end 1312 of the heat tube 131 may be quickly conducted out through the metal cover 133. When the heat dissipation device 1332 is disposed adjacent the lens cover mounting member 1331, i.e., when the distance between the heat dissipation device 1332 and the lens cover mounting member 1331 is relatively small, the portion of the first heat dissipation panel 132 that is connected with the condensation end 1312 may be disposed adjacent the lens cover mounting member 1331 and the heat dissipation device 1332. When the distance between the heat dissipation device 1332 and the lens cover mounting member 1331 is relatively large, the portion of the first heat dissipation panel 132 that is connected with the condensation end 1312 may be disposed adjacent one of the lens cover mounting member 1331 and the heat dissipation device 1332.

In some embodiments, the portion of the first heat dissipation panel 132 that is connected with the condensation end 1312 may extend along the length direction of the heat dissipation device 1332. The extension portion of the first heat dissipation panel 132 may be in thermal contact with a region of the metal cover 133 corresponding to the heat dissipation device 1332. In some embodiments, the length direction of the heat dissipation device 1332 may be the same as the length direction of the action camera 1.

The disclosed configuration can reduce the amount of the heat of the first heat dissipation panel 132 and the condensation end 1312 of the heat tube 131 that stays and is lost in the action camera 1, such that more thermal energy can be quickly conducted out through the heat dissipation device 1332 of the metal cover 133, thereby further improving the heat dissipation effect of the action camera 1. In addition, this configuration does not increase the volume of the action camera 1, and does not affect the portability of the action camera 1.

In the present disclosure, a portion of the heat of the main chip 11 may be transferred to the evaporation end 1311 and the condensation end 1312 of the heat tube 131, and then be transferred to a portion of the first heat dissipation panel 132 that is far away from the main chip 11. Another portion of the heat of the main chip 11 may be directly transferred to the first heat dissipation panel 132. A portion of the heat of the first heat dissipation panel 132 may be transferred to the heat dissipation device 1332 of the metal cover 133, and conducted out of the action camera 1 through the heat dissipation device 1332. Another portion of the heat of the first heat dissipation panel 132 may be transferred to the external housing 19 and lens cover 134 of the action camera 1 through the metal cover 133, and be conducted out of the action camera 1 through the external housing 19 and the lens cover 134.

The lens housing 15 may be configured to primarily acquire external image information, and transmit the image information to the main chip 11. The lens 15 may be provided with an imaging sensor 151, and may receive an electromagnetic wave signal reflected or transmitted by an external object through the imaging sensor 151. The lens 15 may also be provided with an output port. The output port may be communicatively connected with the main chip 11 through a connecting wire. The output port may be configured to transmit the image information generated by the imaging sensor 151 to the main chip 11. In some embodiments, the lens 15 may be provided with a wireless communication module to transmit the image information generated by the imaging sensor 151 to the main chip 11 through a wireless transmission method. Because the imaging sensor 151 may process a large amount of data, it may generate a large amount of heat during the operation. As such, the imaging sensor 151 may be one of the heat generating components of the action camera 1.

In some embodiments, the heat dissipation assembly may also include a second heat dissipation panel 136 configured to dissipate heat for the imaging sensor 151. The second heat dissipation panel 136 and the first heat dissipation panel 132 may be disposed in a staggered manner. The second heat dissipation panel 136 may be configured to be in thermal contact with the imaging sensor 151, and in thermal contact with the external housing 19 of the action camera 1, such that heat of the imaging sensor 151 may be conducted out through the external housing 19 of the action camera 1, thereby realizing heat dissipation for the imaging sensor 151.

Illustratively, the second heat dissipation panel 136 may be in direct contact with a surface of the imaging sensor 151, such that the heat generated by the imaging sensor 151 can be transferred to the second heat dissipation panel 136. In some embodiments, the second heat dissipation panel 136 may be in contact with the imaging sensor 151 through a heat conducting medium, such that the heat generated by the imaging sensor 151 can be transferred to the second heat dissipation panel 136 through the heat conducting medium.

In some embodiments, the second heat dissipation panel 136 and the external housing 19 of the action camera 1 may be components that are independent from one another, such that the structural configuration and location configuration of the second heat dissipation panel 136 are more flexible. The second heat dissipation panel 136 may extend outwardly from the imaging sensor 151 until it contacts the external housing 19 of the action camera 1, such that the heat of the imaging sensor 151 may be conducted out through the external housing 19 of the action camera 1. In some embodiments, a heat conducting medium may be disposed between the second heat dissipation panel 136 and the external housing 19 of the action camera 1, such that the heat transmitted from the imaging sensor 151 to the second heat dissipation panel 136 may be transferred to the external housing 19 of the action camera 1 through the heat conducting medium.

In other examples, the second heat dissipation panel 136 and a portion of the external housing 19 of the action camera 1 may be integrally formed as an integral piece, such that the number of components in the heat dissipation assembly is reduced, which can simplify the assembling of the action camera 1, and such that the second heat dissipation panel and the external housing 19 of the action camera 1 may be in a reliable thermal contact. Illustratively, the second heat dissipation panel 136 may extend from a portion of the external housing 19 that is closest to the imaging sensor 151, in a direction facing the imaging sensor. In some embodiments, the second heat dissipation panel 136 may extend until it can cover a surface of the imaging sensor 151, such that there is a relatively large contacting area between the second heat dissipation panel 136 and the imaging sensor 151. As a result, the heat transfer path is shortened, which can improve the heat dissipation effect on the imaging sensor 151.

For example, when the direction where the lens 15 of the action camera 1 is located is the front end, then the first heat dissipation panel 132 may be located at the front end of the main chip 11, and the second heat dissipation panel 136 may be located at the rear end of the main chip 11, such that the second heat dissipation panel 136 may be in a better contact with the imaging sensor 151.

Because the structure of the lens 15 is complex, and the volume of the lens 15 is relatively large, the imaging sensor 151 of the lens 15 is typically located behind the lens 15, and the imaging sensor 151 is disposed rearwardly relative to the main chip 11, such that the structure of the action camera 1 is more compact.

In some embodiments, the second heat dissipation panel 136 and the first heat dissipation panel 132 may be located at two opposing sides of the main chip 11, respectively. The first heat dissipation panel 132 may be located at the front end of the main chip 11, and the lens 15 may pass through the edge of the first heat dissipation panel 132 or through the first heat dissipation panel 132, such that the lens 15 may be in contact with the first heat dissipation panel 132, and that a portion of the heat of the lens 15 can be transferred to the first heat dissipation panel 132. The second heat dissipation panel 136 may be located at a rear end of the main chip 11, such that the second heat dissipation panel 136 may be in a better contact with the imaging sensor 151, and that the lens 15 has multiple heat dissipation paths.

In some embodiments, the heat dissipation assembly may include a second heat conducting pad. The second heat dissipation panel 136 may be in thermal contact with the imaging sensor 151 through the second heat conducting pad. The second heat conducting pad may be made of a heat conducting medium and may have a flake-shaped structure having certain elasticity, such as a flake-shaped structure made of a silicone gel and having certain elasticity.

Through disposing the second heat conducting pad between the second heat dissipation panel 136 and the imaging sensor 151, the second heat conducting pad may suitably fill the gaps between the second heat dissipation panel 136 and the imaging sensor 151, such that there is a relatively large contacting area between the second heat dissipation panel 136 and the imaging sensor 151, thereby improving the heat conducting efficiency between the second heat dissipation panel 136 and the imaging sensor 151. The disclosed configuration is advantageous for enhancing the heat dissipation effect on the imaging sensor 151, and advantageous for enhancing the heat dissipation effect on the action camera 1.

The action camera 1 may include a battery chamber 1b configured to receive the battery 17. Further, the external housing 19 may be provided with a battery chamber opening 1c configured for the battery 17 to enter or exit the battery chamber 1b. Because the battery 17 typically has a flat shape, the battery chamber opening 1c may be located at a side of the external housing 19. For example, the battery chamber opening 1c may be located at the left side, right side, upper side, or lower side of the external housing 19. The disclosed configuration is advantageous for the structural compactness of the action camera 1. The direction in which the battery 17 enters or exits the battery chamber 1b may be perpendicular to the optical axis direction of the lens 15 of the action camera 1.

Figure 3:
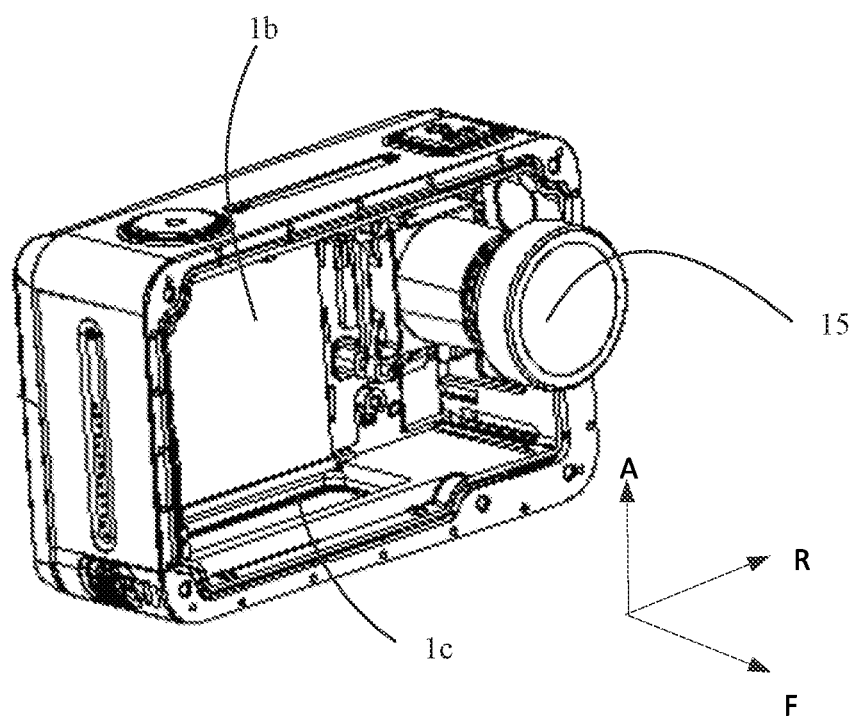
FIG. 3 is a structural schematic diagram of the action camera when a lens is assembled to an external housing, according to an example embodiment.
Figure 4:
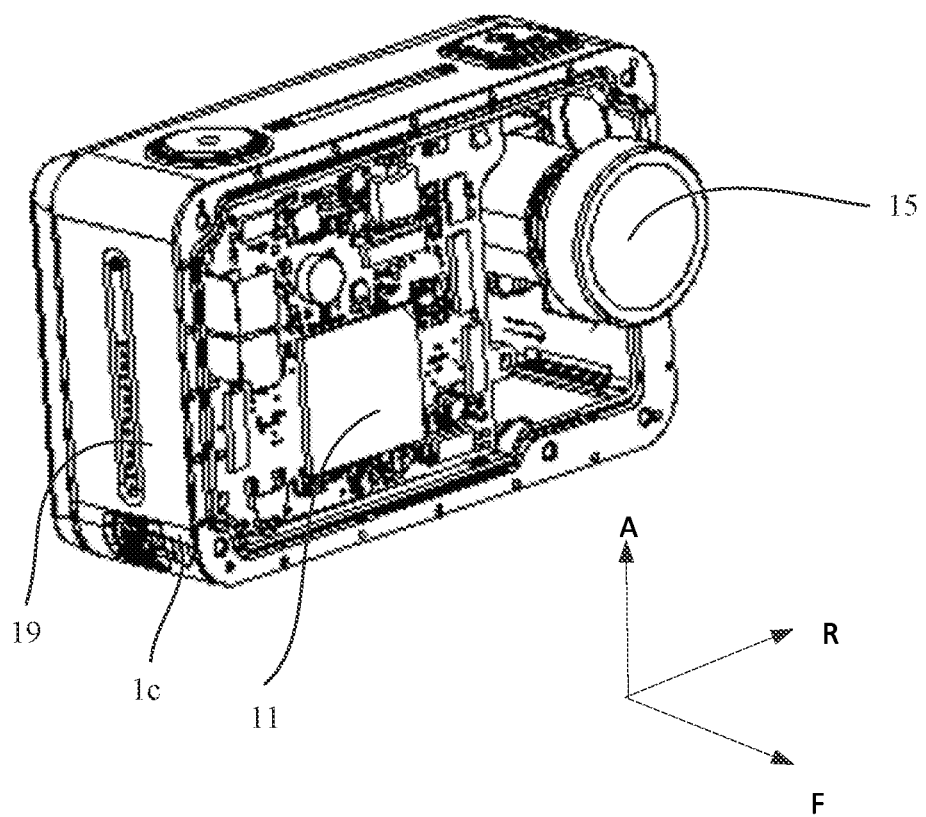
FIG. 4 is a structural schematic diagram of the action camera when the lens and a main chip are assembled to the external housing, according to an example embodiment.
Figure 5:
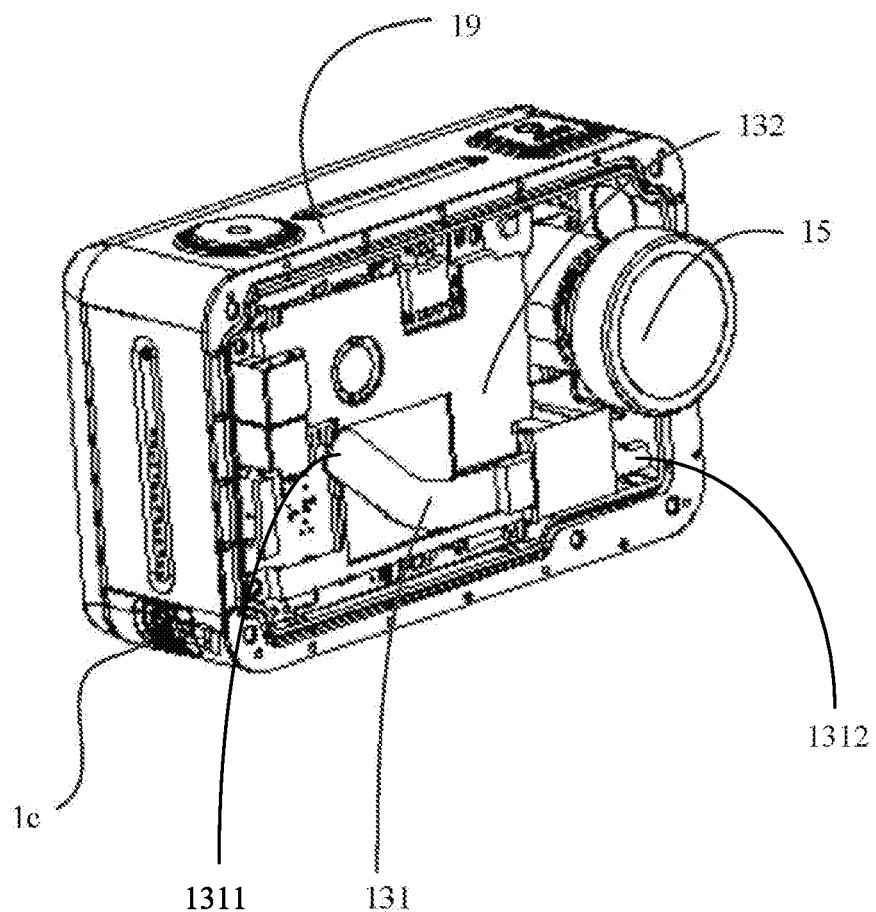
FIG. 5 is a structural schematic diagram of the action camera when the lens, the main chip, and a first heat dissipation panel are assembled to the external housing, according to an example embodiment.
Figure 6:
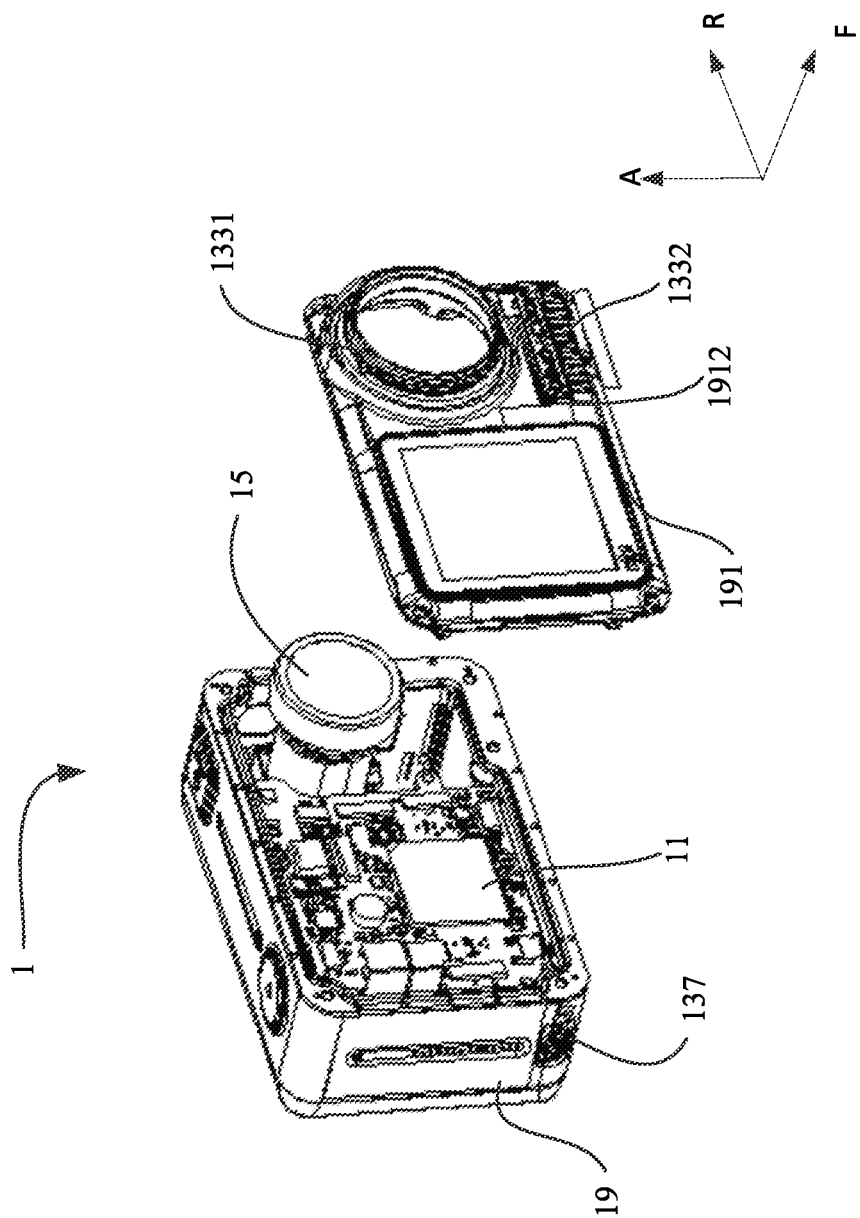
FIG. 6 is a structural schematic diagram of the action camera when the lens, the main chip, and the first heat dissipation panel are assembled to the external housing, and when a metal cover, a plastic front cover, and a lens cover are assembled, according to an example embodiment.
Figure 7:
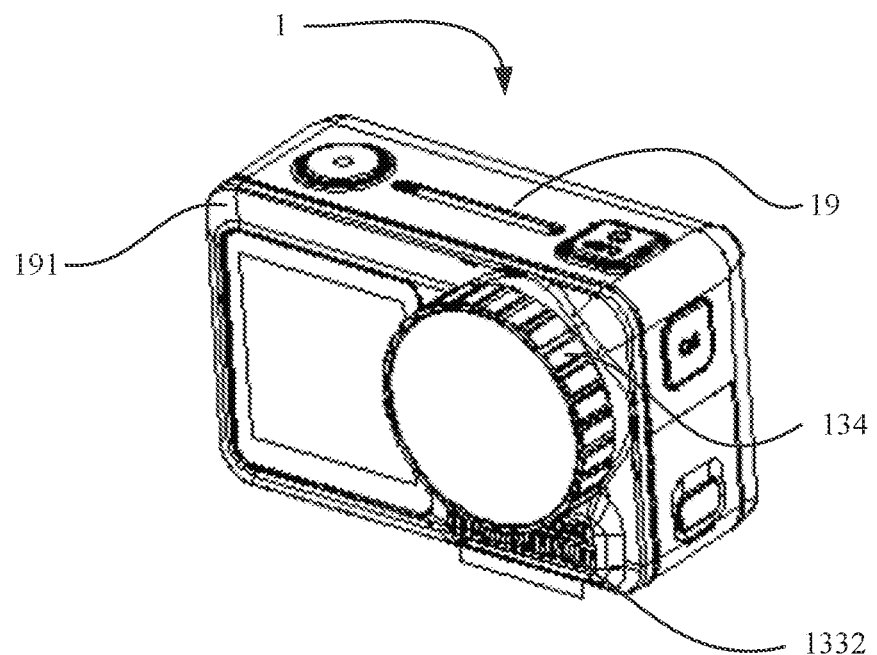
FIG. 7 is a structural schematic diagram of the action camera when the assembling is complete, according to an example embodiment.

In the present disclosure, as shown in FIG. 3 to FIG. 5, the main chip 11 may be located between the battery chamber 1b and the first heat dissipation panel 132, i.e., the main chip 11 may be located at a front side of the battery chamber 1b, and the first heat dissipation panel 132 may be located at a front side of the main chip 11. That is, the battery chamber 1b, the main chip 11, and the first heat dissipation panel 132 may be distributed in parallel in a direction from back to front. In some embodiments, the imaging sensor 151 of the action camera 1 and the main chip 11 may be located at a same side of the battery chamber 1b, such that the structure of the action camera 1 may become more compact.

Illustratively, the imaging sensor 151 may be disposed to flush with the main chip 11. In some embodiments, the imaging sensor 151 may be disposed backwardly relative to the main chip 11, to further benefit the structural compactness of the action camera 1. In some embodiments, the second heat dissipation panel 136 configured to dissipate heat for the imaging sensor 151 may be located at a rear side of the imaging sensor 151, i.e., the second heat dissipation panel 136 may be located at a rear side of the main chip 11, and the first heat dissipation panel 132 configured to dissipate heat for the main chip 11 may be located at a front side of the main chip 11.

The battery 17 in the battery chamber 1b may be configured to primarily allocate and provide an electric power to various electrical components of the action camera 1, and may generate a large amount of heat during operation. As such, the battery 17 may be one of the heat generating components of the action camera 1.

In some embodiments, the heat dissipation assembly may include a metal battery cover 137 configured to cover the battery chamber opening 1c of the action camera 1. The metal battery cover 137 may be connected with the battery 17 of the action camera 1, and may form a portion of the external housing 19 of the action camera 1. In some embodiments, the metal battery cover 137 may be configured to be in thermal contact with at least a portion of the surface of the battery 17, such that the heat of the battery 17 may be conducted out through the external housing 19 of the action camera 1.

In some embodiments, the metal battery cover 137 covering the battery chamber opening 1c may be in thermal contact with at least a portion of the surface of the battery 17. The metal battery cover 137 may form a portion of the external housing 19 of the action camera 1 and may be exposed, such that the metal battery cover 137 may exchange heat with the air outside of the action camera 1 to conduct the heat of the battery 17 out through the external housing 19 of the action camera 1.

The metal battery cover 137 may be detachably connected with the battery chamber opening 1c through a detachable connection method such as thread connection, snap-fit connection, etc., such that it is convenient to take out or insert the battery 17. In some embodiments, the metal battery cover 137 and the battery 17 may be independent components. In some embodiments, the metal battery cover 137 may directly contact a surface of the battery 17. In some embodiments, the metal battery cover 137 may contact the surface of the battery 17 through a heat conducting medium, such tha the heat of the battery 17 can be transferred to the metal battery cover 137. In other embodiments, the battery 17 and the metal battery cover 137 may be integrally formed as an integral piece, to reduce the number of components in the action camera 1, and simplify the assembling process of the battery 17, which is advantageous for a reliable heat transfer contact between the battery 17 and the metal battery cover 137, thereby simplifying the heat transfer path and reducing the heat loss during the heat transfer process.

In some embodiments, a plastic member 138 may be provided at an outer surface of the metal battery cover 137 that faces away from the battery 17. The plastic member 138 may have a convection with the air outside of action camera 1, thereby quickly dissipating the heat generated by the battery 17. In the meantime, because the outer side of the metal battery cover 137 is a plastic member made of a plastic material, the issue of burning hand due to the temperature increase can be solved, avoiding burning and injuring an operator.

The present embodiment also provides a heat dissipation assembly. The structure, function, and realization process may be the same as those of the heat dissipation assembly in any other above-described embodiments, which are not repeated.

It can be understood that the heat dissipation assembly of the present disclosure is suitable not only for the action camera 1. At least some features of the heat dissipation assembly can be suitable for other image acquisition devices, such as surveillance devices, etc. At least some features of the heat dissipation assembly can be suitable for other terminal devices having computing and control functions.

Finally, although advantages related to some embodiments of the present technical solution have been described in the contexts of these embodiments, other embodiments may also include such advantages. In addition, all of the advantages of the present disclosure have not been described in all of the embodiments. Advantages objectively brought by the technical features of the embodiments should all been regarded as advantages of the present disclosure differing from prior technologies, and all belong to the protection scope of the present disclosure. Other embodiments of the present disclosure will be apparent to those skilled in the art from consideration of the specification and practice of the embodiments disclosed herein. It is intended that the specification and examples be considered as example only and not to limit the scope of the present disclosure, with a true scope and spirit of the invention being indicated by the following claims. Variations or equivalents derived from the disclosed embodiments also fall within the scope of the present disclosure.

What is claimed is:

1. A camera, comprising:
    an external housing; and
    a heat dissipation assembly configured to dissipate heat from at least one heat generating component of the camera,
    wherein the heat dissipation assembly includes a heat tube and a first heat dissipation panel,
    wherein an evaporation end and a condensation end of the heat tube are both in thermal contact with the first heat dissipation panel, and the condensation end of the heat tube is disposed farther away from the at least one heat generating component relative to the evaporation end of the heat tube, and
    wherein the first heat dissipation panel is configured to be in thermal contact with the external housing to conduct the heat from the at least one heat generating component through the external housing.

2. The camera according to claim 1, wherein
    the first heat dissipation panel includes a first surface and a second surface that are opposingly disposed,
    a portion of the first surface covers the at least one heat generating component, and
    the heat tube is disposed on the second surface.

3. The camera according to claim 2,
    wherein a portion of the heat tube located adjacent the evaporation end is obliquely disposed relative to an extending direction of a length of the at least one heat generating component, and
    wherein a groove is formed in a region of the second surface corresponding to the at least one heat generating component, and the portion of the heat tube located adjacent the evaporation end is disposed in the groove.

4. The camera according to claim 1,
    wherein the heat dissipation assembly also includes a metal cover; and
    wherein the metal cover is a portion of the external housing or at least a portion of the metal cover is disposed under the external housing and is thermally connected with the first heat dissipation panel.

5. The camera according to claim 4, wherein the heat dissipation assembly also includes a first heat conducting pad configured to be in thermal contact with the first heat dissipation panel and the metal cover.

6. The camera according to claim 4, wherein
    the heat dissipation assembly also includes a lens cover,
    at least a portion of the lens cover is made of a metal material, and
    the lens cover is provided with a lens cover mounting member configured to mount the lens cover.

7. The camera according to claim 6,
    wherein the first heat dissipation panel is distributed along at least a portion of a circumference of the lens cover mounting member.

8. The camera according to claim 6,
    wherein the lens cover mounting member is a protrusion member of the metal cover that faces away from the first heat dissipation panel, and
    wherein the protrusion member is provided with a thread and the lens cover is connected with the metal cover through the thread.

9. The camera according to claim 6, wherein the lens cover includes:
    a metal heat dissipation ring, wherein an inner wall of the metal heat dissipation ring extends inwardly in a radial direction to form a bearing member; and
    a heat conducting ring disposed at the inner wall of the metal heat dissipation ring, wherein the heat conducting ring is configured to abut against the bearing member and wherein an inner wall of the heat conducting ring is configured to contact and couple with a lens.

10. The camera according to claim 9,
    wherein the metal heat dissipation ring is a beryllium-copper alloy heat dissipation ring,
    wherein the bearing member is located at an end of the inner wall of the metal heat dissipation ring, and
    wherein a first end of the heat conducting ring is configured to abut against the bearing member and a second end of the heat conducting ring is configured to be flush with an end of the metal heat dissipation ring.

11. The camera according to claim 9,
wherein the lens cover includes an elastic ring disposed at the inner wall of the heat conducting ring, an inner wall of the elastic ring being configured to contact and couple with the lens.

12. The camera according to claim 6,
wherein the external housing includes a plastic front cover disposed at a side of the metal cover facing away from the at least one heat generating component, and
wherein the plastic front cover is provided with a lens passing hole, and the lens cover mounting member and the lens cover are connected at the lens passing hole.

13. The camera according to claim 6,
wherein a heat dissipation device is disposed at a side of the metal cover facing away from the first heat dissipation panel, and
wherein a portion of the first heat dissipation panel that is connected with the condensation end is disposed adjacent at least one of the lens cover mounting member or the heat dissipation device.

14. The camera according to claim 13, wherein the portion of the first heat dissipation panel that is connected with the condensation end extends along a length direction of the heat dissipation device and is in thermal contact with a region of the metal cover corresponding to the heat dissipation device.

15. The camera according to claim 13, wherein the heat dissipation device includes multiple heat dissipation fins disposed in sequence in a direction.

16. The camera according to claim 13,
wherein the external housing includes a plastic front cover, the plastic front cover being disposed at a side of the metal cover facing away from the at least one heat generating component and being provided with a heat dissipation window, and
wherein at least a portion of the heat dissipation device is located in the heat dissipation window.

17. The camera according to claim 1, further comprising an imaging sensor,
wherein the heat dissipation assembly includes a second heat dissipation panel disposed in a staggered manner with the first heat dissipation panel, and
wherein the second heat dissipation panel is configured to be in thermal contact with the imaging sensor and the external housing to conduct heat of the imaging sensor through the external housing.

18. The camera according to claim 17,
wherein the second heat dissipation panel and a portion of the external housing of the camera are integrally formed as an integral piece,
wherein the second heat dissipation panel and the first heat dissipation panel are located at two opposing sides of the at least one heat generating component, respectively, and
wherein the heat dissipation assembly includes a second heat conducting pad, the second heat dissipation panel being in thermal contact with the imaging sensor through the second heat conducting pad.

19. The camera according to claim 1, further comprising a battery,
wherein the heat dissipation assembly includes a metal battery cover disposed to cover a battery chamber opening, and
wherein the metal battery cover is connected with the battery and forms a portion of the external housing, the metal battery cover being configured to be in thermal contact with at least a portion of a surface of the battery to conduct heat of the battery through the external housing.

20. The camera according to claim 19,
wherein the battery and the metal battery cover are integrally formed as an integral piece,
wherein an external surface of the metal battery cover is provided with a plastic member, and
wherein the battery chamber opening is disposed at a side of the camera, the battery chamber opening configured to depress inwardly toward an inside of the camera to form a battery chamber configured to receive the battery, a direction of the battery entering and exiting the battery chamber being perpendicular to an optical axis direction of a lens.

\* \* \* \* \*